United States Patent [19]

Trumpp et al.

[11] Patent Number: 4,502,914
[45] Date of Patent: Mar. 5, 1985

[54] METHOD OF MAKING STRUCTURES WITH DIMENSIONS IN THE SUB-MICROMETER RANGE

[75] Inventors: Hans-Joachim Trumpp, Stuttgart; Johann Greschner, Pliezhausen, both of Fed. Rep. of Germany

[73] Assignee: International Business Machines Corporation, Armonk, N.Y.

[21] Appl. No.: 546,612

[22] Filed: Oct. 28, 1983

[30] Foreign Application Priority Data

Nov. 13, 1982 [DE] Fed. Rep. of Germany ....... 3242113
Oct. 5, 1983 [EP] European Pat. Off. ........ 83109945.2

[51] Int. Cl.³ .................. H01L 21/306; B44C 1/22; C03C 15/00; B29C 17/08
[52] U.S. Cl. .................. 156/643; 29/576 W; 29/580; 156/646; 156/648; 156/653; 156/655; 156/657; 156/659.1; 156/662; 156/668; 204/192 EC; 204/192 E; 357/49; 427/93
[58] Field of Search .......... 29/576 W, 580; 357/49; 204/164, 192 EC, 192 E; 156/643, 646, 648, 653, 655, 657, 659.1, 668, 662; 427/38, 39, 93, 94; 148/1.5, 187; 252/79.1

[56] References Cited

U.S. PATENT DOCUMENTS

| | | | |
|---|---|---|---|
| 4,042,726 | 8/1977 | Kagi et al. | 156/648 X |
| 4,313,782 | 2/1982 | Sokoloski | 156/657 X |
| 4,331,708 | 5/1982 | Hunter | 156/657 X |
| 4,334,348 | 6/1982 | Frenary et al. | 156/657 X |
| 4,354,896 | 10/1982 | Hunter et al. | 156/643 |
| 4,454,014 | 6/1984 | Bischoff | 156/657 X |

Primary Examiner—William A. Powell
Attorney, Agent, or Firm—George O. Saile

[57] ABSTRACT

Following the method of making structures with dimensions in the submicrometer range, structures of a polymeric layer with horizontal and substantially vertical surfaces are first made on a substrate. Thereupon, a silicon nitride or oxide layer is plasma deposited. This layer is subjected to reactive ion etching methods in such a manner that its horizontal regions and the polymeric structures are removed, with merely the narrow regions of the silicon nitride or oxide layer that had originally been arranged adjacent the vertical surfaces of the polymeric structures remaining. In the case of positive lithography, the silicon nitride or oxide walls are converted into a mask with the same dimensions but consisting of a different mask material. In the case of negative lithography the silicon nitride or oxide walls are converted in a mask reversal process into openings in a mask material layer through which by means of reactive ion etching vertical trenches approximately 0.5 μm deep can be etched in the silicon substrate. The trenches are filled by thermal oxidation or with a synthetic material as e.g. polyimide. The method as disclosed by the invention can also be applied to other processes than recessed isolation in semiconductor technology.

22 Claims, 31 Drawing Figures

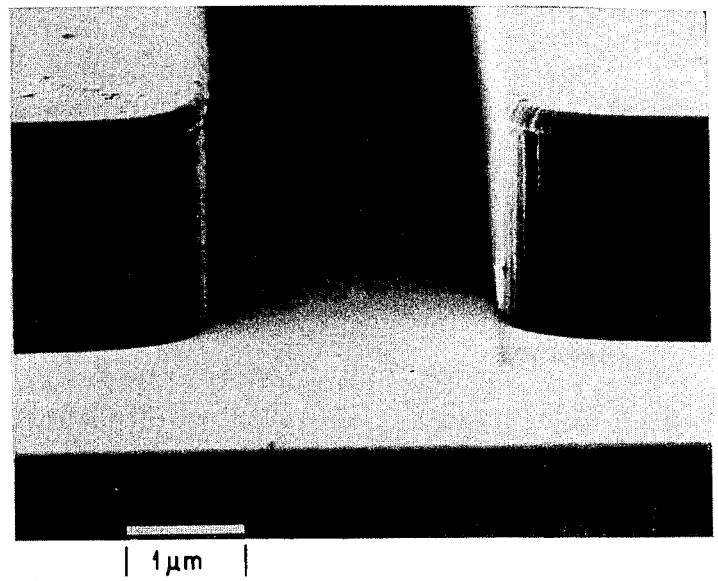
FIG. 16 (CORRESPONDS TO FIG. 4)
RESIST WITH VERTICAL SIDEWALLS REACTIVE
ION ETCHED AT LOW OXYGEN PRESSURE
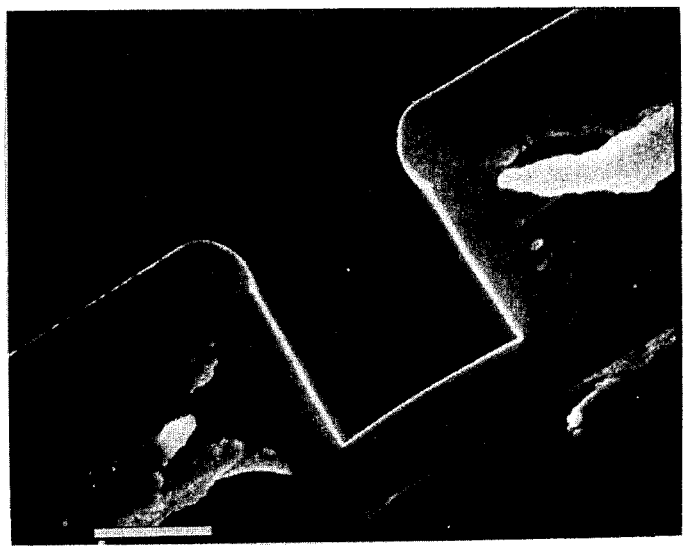
FIG. 17 (CORRESPONDS TO FIG.5)
RESIST WITH VERTICAL SIDEWALLS COATED WITH NITRIDE

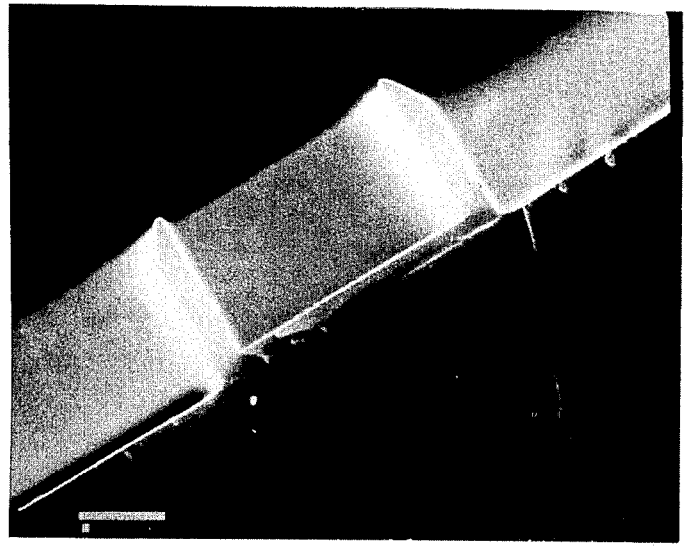
FIG.18 (CORRESPONDS TO FIG.6)
ABOUT 0.3 μm WIDE VERTICAL NITRIDE WALLS
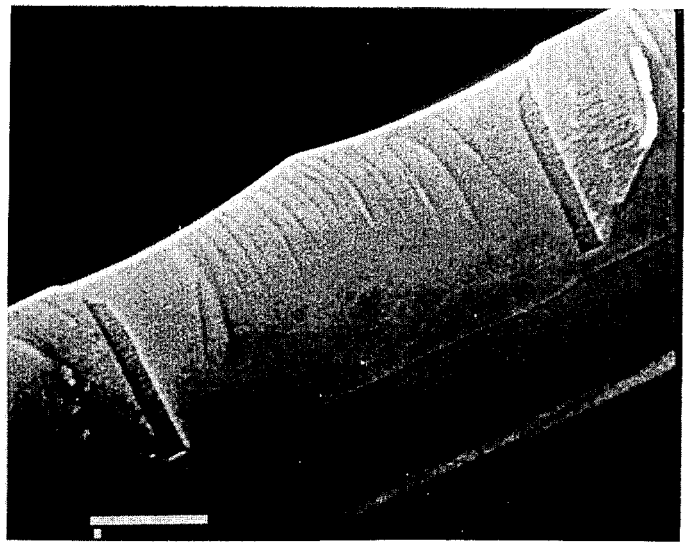
FIG.19 (CORRESPONDS TO FIG.7A)
NITRIDE WALLS EMBEDDED IN SPUTTERED QUARTZ
(1.3 μm STANDARD $SiO_2$; 0.5 μm PLANAR $SiO_2$)

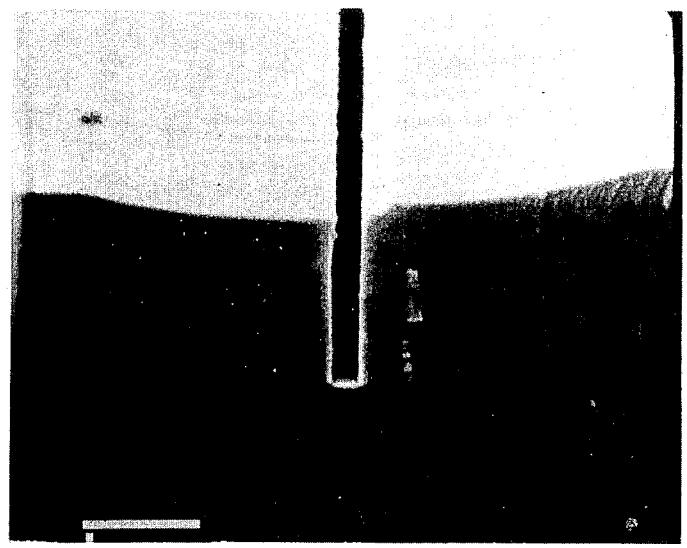
FIG. 20  (CORRESPONDS TO FIG. 9)
SiO₂ MASK OPENED DOWN TO Si SUBSTRATE
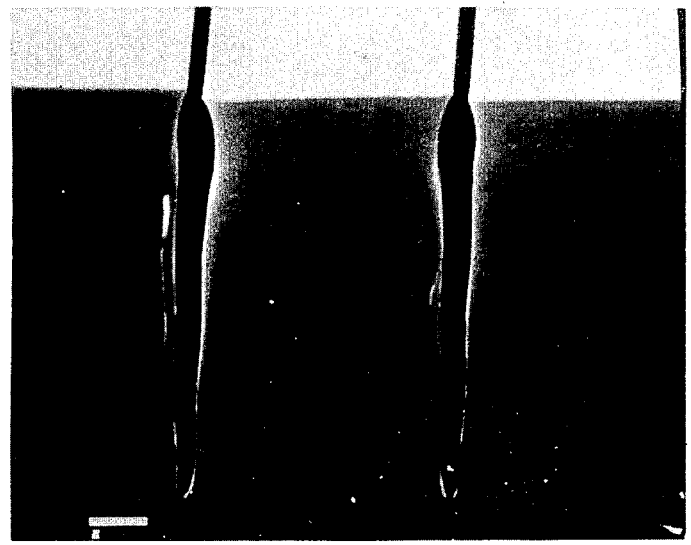
FIG. 21  (CORRESPONDS TO FIG. 10)
TRENCHES ETCHED IN Si, SiO₂ MASK STRIPPED (CORRESPONDS TO FIG.12)
Si TRENCH FILLED BY THERMAL OXIDATION

METHOD OF MAKING STRUCTURES WITH DIMENSIONS IN THE SUB-MICROMETER RANGE

DESCRIPTION

1. Technical Field

The invention relates to a method of making structures with dimensions in the sub-micrometer range, and to the implementation of this method to make a deep dielectric isolation with sub-micrometer width in a silicon body.

2. Background Art

A number of methods are known to increase the integration density of integrated circuits. Considerable increases of integration density have recently been achieved mainly by decreasing photolithographic defect densities. By using electron and X-ray exposure methods instead of the hitherto used light radiation, a progress was made in the direction of a higher optical resolution. There were furthermore efforts to reach very narrow line widths in the 1 $\mu$m range and less by extending conventional lithographic processes, avoiding the cost-intensive techniques of electron and X-ray lithography. With the technique of plasma or reactive ion etching for etching metals, semi-conductive and dielectric materials further developments took place in the direction of very narrow line widths, and consequently toward an increased integration density.

A number of publications and patents describe the so-called sidewall technology by means of which structures in the sub-micrometer range can be made. In IEEE Electron Device Letters, Vol. EDL-2, No. 1, January 1981, pp. 4 to 6, a method is described where vertical (anisotropic) dry etching methods are applied for making MOSFETs which are defined by an edge and have dimensions in the sub-micrometer range. The technology described permits the production of physical channel lengths of the MOSFETs in the 0.1 to 0.15 $\mu$m range.

U.S. Pat. No. 4,358,340 describes a method of making sub-micrometer devices, but without using the sub-micrometer lithography, where a conductive thin film with dimensions in the sub-micrometer range is deposited across a vertical step between adjacent surfaces of an isolation, and subsequently vertically etched until there only remains that part of the conductive film which is adjacent the vertical step. The remaining isolation not covered by the conductor is removed, thus obtaining a gate of an MOS field effect transistor with a width in the sub-micrometer range which equals the layer thickness of the originally applied thin film.

U.S. Pat. No. 4,209,349 describes a method of forming very small mask openings for making semiconductor circuit arrangements. According to this method, first insulator regions are formed on a substrate so that substantially horizontal as well as substantially vertical surfaces are obtained. A second insulator layer is applied thereon of a material different from that of the first insulator layer, and it is subjected to a reactive ion etching process in such a manner that the horizontal regions of the second insulator layer are removed, with merely very narrow regions of this layer remaining on the vertical surface regions of the first insulator layer, and the respective regions of the substrate, respectively. Subsequently, the exposed substrate regions are thermally oxidized, and for finally forming the desired mask openings the regions of the second insulating layer there are removed. By means of this method, minimum dimensions smaller than those of hitherto applied photolithographic methods are to be obtained.

In the process of this U.S. patent, the first insulator layer (silicon dioxide) determines the position and thickness of the mask (column 2, line 62). All openings in the insulator layer are made by standard photolithography and etching techniques (column 3, line 21) according to which no vertical sidewalls can be made. In the method as disclosed by the invention however a polymeric layer determines position and thickness of the mask. In the method of the U.S. patent, only hot processes are applied, e.g. a thermal oxidation at 970° C. (column 4, line 65), and the chemical vapor deposition of silicon nitride at approximately 1000° C. (column 5, line 69), whereas in the method as disclosed by the invention so-called cold processes at less than 300° C. are performed permitting a more universal application of the method. With the method of the U.S. patent, masks with a layer thickness of less than 0.5 $\mu$m can be made which are not suitable as masks e.g. for etching deep trenches. With the method as disclosed by the invention however masks with a thickness of 2 to 3 $\mu$m can be made that can be used for etching 4 to 5 $\mu$m deep trenches in a silicon substrate. From thermal oxidation (column 4, line 64 of the U.S. patent) there results an asymmetrical mask with the bird's beak problem being involved which originates from the forming of a non-planar silicon dioxide on the trench surface, so that the mask cannot be used for trench etching also for that reason. The mask made in accordance with the invention has strictly vertical sidewalls and is of a symmetrical structure.

A feature common to all hitherto known methods is that for making structures with vertical sidewalls and dimensions in the sub-micrometer range materials as polysilicon, silicon nitride or silicon dioxide are used which are all deposited at higher temperatures. None of the publications describes the use of polymeric materials for the purpose.

SUMMARY OF THE PRESENT INVENTION

Using the method as disclosed by the invention is particularly advantageous in the production of deep dielectric isolations with sub-micrometer width in a semiconductor body. In the following, the various isolation methods will be briefly referred to. One of the known isolation methods for isolating against each other various active and/or passive elements in integrated circuit structures is the so-called junction isolation, where isolation regions are formed in the semiconductor regions are surrounded with oppositely doped semiconductor regions. The thus formed semiconductor junctions form reverse-operated diodes effecting isolation. Another known isolation method is the so-called dielectric isolation. There, the semiconductor regions to be isolated are surrounded with a dielectric isolation region. In an embodiment thereof, trenches are made in silicon in which the isolation regions are subsequently made. During the etching of the trenches, the remaining semiconductor substrate surface is protected by a protective layer consisting of a silicon dioxide-silicon nitride sandwich structure. Following the forming of the trenches, the silicon semiconductor substrate is conventionally oxidized, so that the silicon in the trench region is oxidized and the resulting silicon dioxide fills the trenches. In the conventional thermal oxidation for filling the trenches with oxide however undesired structures appear at the trench edges which are called "bird's beak". The term bird's beak refers to the forming of a non-planar silicon dioxide on the trench surface which is caused by lateral oxidation underneath the silicon dioxide layer and which effects an elevation of the silicon dioxide/silicon nitride structure at the trench edges. The direct bordering of diffusions at the isolation which represents an essential advantage of the originally planned dielectric isolation is thus no longer possible.

An alternative to the embedded oxide isolation is the deep dielectric isolation comprising the forming of rectangular trenches through reactive ion etching methods, and the filling of these trenches to form the isolation for the various silicon regions of the substrate. This method, too, presents some important disadvantages, e.g. no thermal oxide can be used for filling the trenches but only an oxide which is chemically vapor deposited out of a silane and oxygen-containing phase, or polysilicon. Filling of the trenches with oxide through chemical vapor deposition can in turn cause a poor oxide quality or a seam in the middle of the trenches which can influence the continuity of the metallic conductor on the surface, and finally cause conductivity defects. During the various subsequent temperature processes, the chemically vapor deposited oxide does not have the same thermal expansion coefficient as silicon, and causes tensions round the trenches at process temperatures around 1000° C. Furthermore, chemically vapor deposited oxide is difficult to planarize.

It is therefore desirable to have a method available according to which deep dielectric isolations with sub-micrometer width can be made which do not have the above specified disadvantages. It is furthermore intended to provide dielectric isolations with a width of approximately 1 μm and a depth of approximately 5 μm in silicon semiconductor substrates.

The invention as characterized in the claims achieves the object of providing an improved lithography method with reduced line widths down into the sub-micrometer range. A further object of the invention is the application of this method to make deep dielectric isolations with widths in the sub-micrometer range.

To summarize, the method as disclosed by the invention provides a structure of polymeric material with vertical sidewalls, the latter serving to make sidewall structures of silicon dioxide or nitride with dimensions in the sub-micrometer range. These sidewall structures can be used as masks directly. For the negative lithography, another layer is alternatively applied over the sidewall structures, which is partly removed until the peaks of the sidewall structures are exposed. Subsequently the sidewall structures themselves are removed. The resulting opening can then be used as a mask for a plurality of processes for making integrated circuits. The invention also comprises the application of the method of making deep dielectric isolations with sub-micrometer width in a silicon semiconductor body.

BRIEF DESCRIPTION OF THE DRAWINGS

The drawings show the following:
FIG. 16 is a secondary electron microscope or scanning electron microscope graph (SEM) corresponds to FIG. 4 and shows a photoresist profile as an example of a polymeric material with vertical sidewalls;
FIG. 17 is an SEM corresponding to FIG. 5 and shows the silicon nitride-covered photoresist with vertical sidewalls;
FIG. 18 is a SEM corresponding to FIG. 6 and shows approximately 0.3 μm wide silicon nitride walls;
FIG. 19 is a SEM corresponding to FIG. 7A and shows silicon nitride walls embedded in silicon dioxide deposited by means of cathode sputtering;
FIG. 20 is a SEM corresponding to FIG. 9 and depicts a silicon dioxide mask opened down to the silicon substrate;
FIG. 21 is a SEM corresponding to FIG. 10 and depicts the deep trenches in the silicon, with the silicon dioxide mask having already been removed.

DISCLOSURE OF THE INVENTION

With the method as disclosed by the invention and according to a preferred embodiment, silicon dioxide or the like etching masks with openings having a sub-micrometer width such as 0.2 μm wide openings with vertical sidewalls can be made. These etching masks used can be as an example for etching trenches in the slicon substrate with a width of 0.5 μm. The trenches are subsequently filled with dielectric material.

Figure 1A:
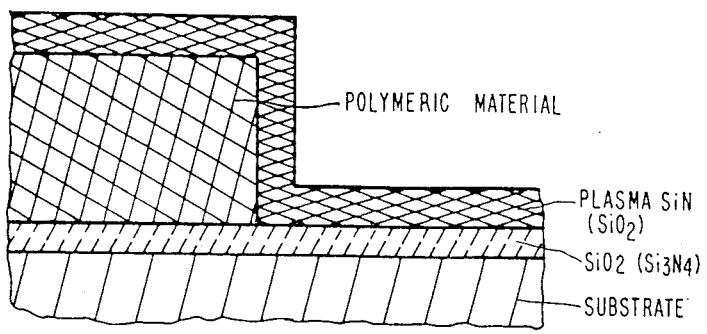
FIGS. 1A to 1F illustrate a basic method of the invention for negative lithography.
Figure 1B:
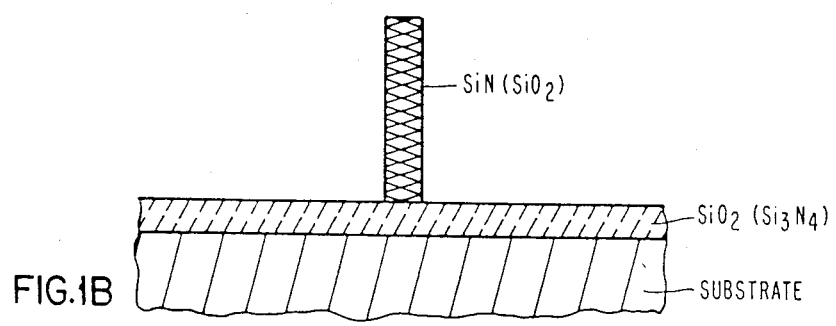
Figure 1C:
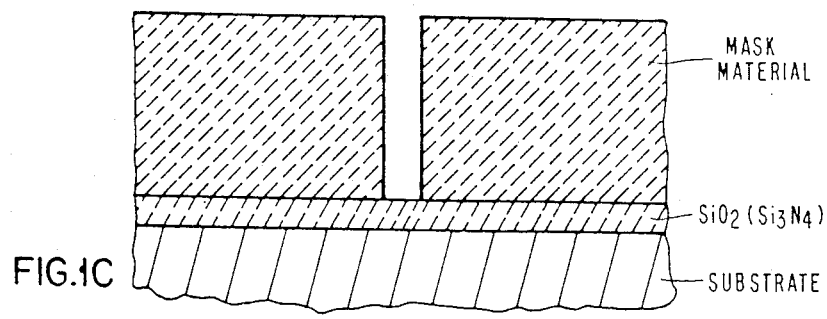
Figure 1D:
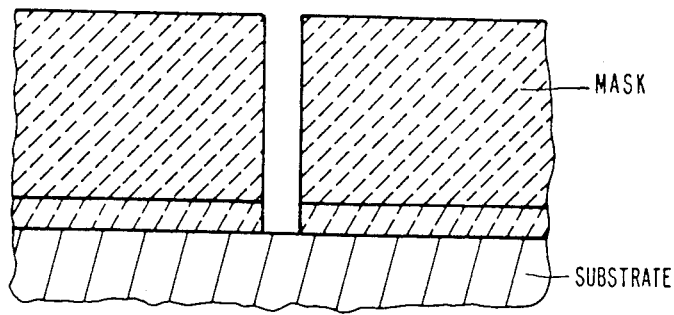

The making an etching mask in a negative lithography process involves the following steps, following the basic method in accordance with FIGS. 1A to 1D:
forming a vertical profile in a polymeric material layer by reactive ion etching, and plasma depositing silicon nitride or silicon dioxide (FIG. 1A);
removing silicon nitride or silicon dioxide from all horizontal surfaces by reactive ion etching, and removing the polymeric material, thus obtaining silicon nitride or silicon dioxide walls (FIG. 1B);

converting the silicon nitride or silicon dioxide walls into openings of a mask in a reversal process by depositing the mask material over the silicon nitride or silicon dioxide walls, removing the mask material by etching until the peaks of the silicon nitride or silicon dioxide walls are exposed, and removing the silicon nitride or silicon dioxide walls by plasma etching or wet etching (FIG. 1C);

opening the mask down to the substrate (FIG. 1D).

Figure 1E:
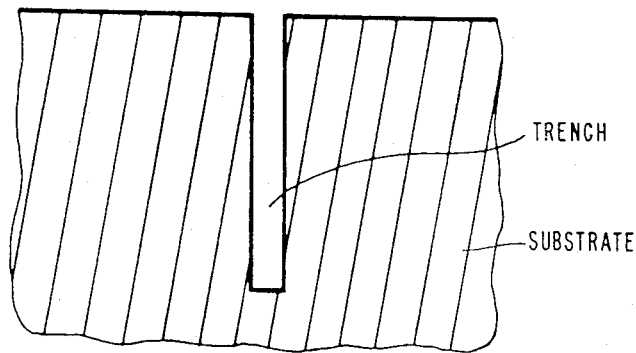
Figure 13:
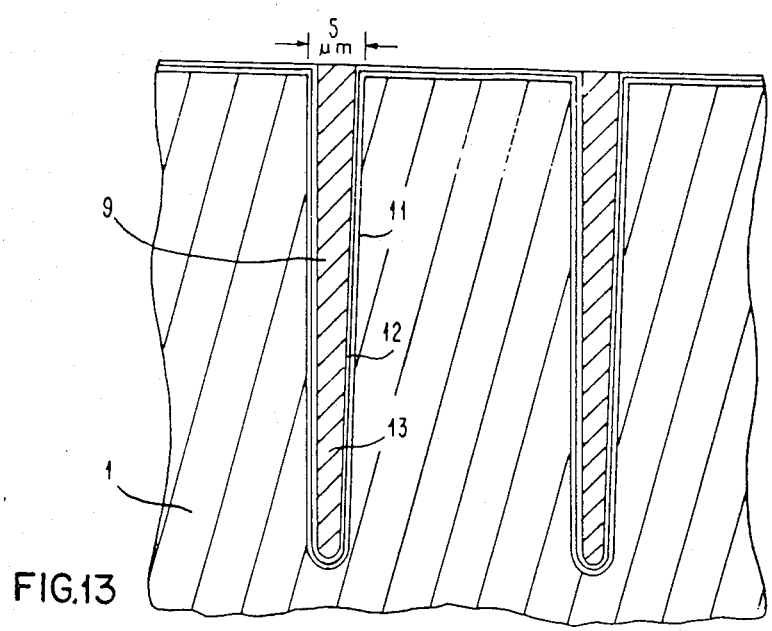
FIG. 13 illustrates filling the trenches with synthetic material.

Using the thus made mask trenches are etched into the silicon substrate by reactive ion etching, and the mask material is removed (FIG. 1E). Subsequently, the trenches are filled by thermal oxidation with silicon dioxide or with any other material. The silicon dioxide on the substrate surface is removed by reactive ion etching (FIG. 1F), and the silicon is reoxidized to form a layer thickness required for further processes. If the trenches are filled with polyimide, the reoxidation is performed following the hot processes. Prior to the filling with polyimide 13 (FIG. 13), a thermal oxidation is executed until the trench walls are covered with an approximately 15 nm thick oxide layer 11. This layer is sealed by depositing approximately 50 nm silicon nitride 12.

Figure 2A:
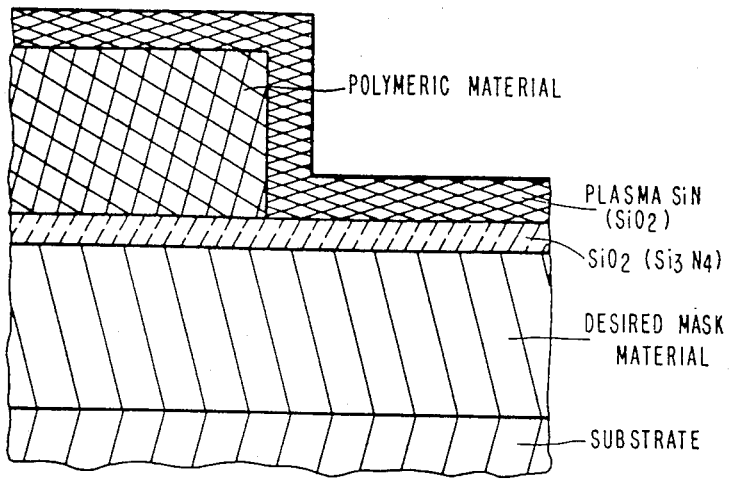
FIGS. 2A to 2C illustrate a basic method of the invention for positive lithography.
Figure 2B:
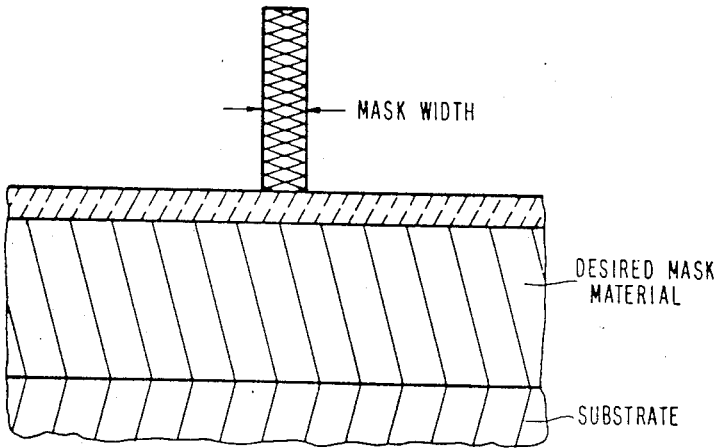
Figure 2C:
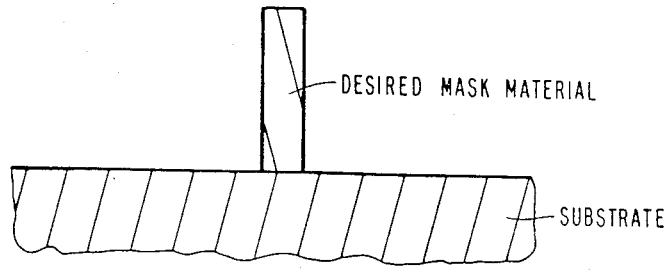

For making a mask of a different mask material, but with the same dimensions the following steps have to be performed in accordance with FIGS. 2A to 2C:

as described above, forming a vertical profile in a polymeric material layer, and plasma depositing silicon nitride or silicon dioxide (FIG. 2A);

removing silicon nitride or silicon dioxide from all horizontal surfaces, and removing the polymeric material, thus obtaining silicon nitride or silicon dioxide walls (FIG. 2B);

converting the mask according to FIG. 2B into a mask with identical dimensions, but made of a different material (FIG. 2C) by means of reactive in etching and stripping the walls of silicon nitride or silicon dioxide, respectively.

With reference to FIGS. 3 to 9 and 14 and 15, the lithography method as disclosed by the invention is described in general, and following that, with reference to a specific embodiment (FIGS. 10 to 13), the making of a deep dielectric isolation in a silicon semiconductor body is described.

Figure 3:
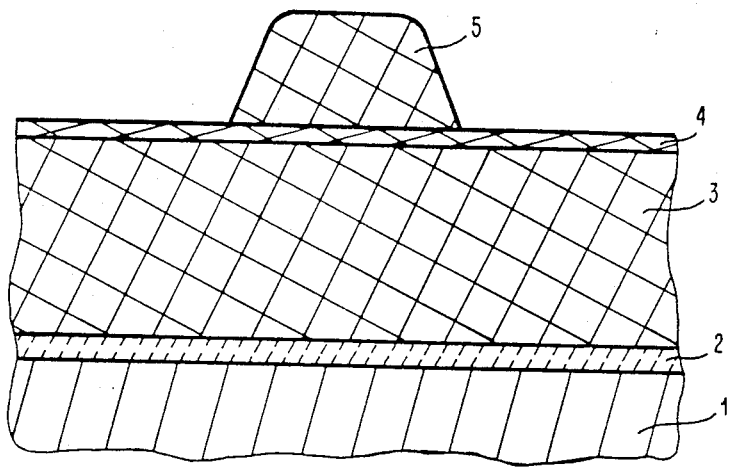
FIG. 3 is a three-layer structure for making a vertical profile of polymeric material.

According to FIG. 3, a layer 2 of dielectric material is applied on a silicon semiconductor substrate in a conventional manner. Layer 2, to give an example, can consist of silicon dioxide produced by thermal oxidation at 925° C. Layer 2 can also consist of a silicon dioxide and a silicon nitride layer, with the silicon dioxide layer being approximately 160 nm thick, and the silicon nitride layer approximately 100 nm. The silicon dioxide layer is usually produced by thermal oxidation, and the silicon nitride layer is deposited in a known manner out of an atmosphere containing silane, ammonia, and argon, at a temperature of approximately 1000° C. Instead of the double layer of silicon dioxide-silicon nitride, it is also possible to apply a double layer of silicon dioxide and polysilicon, or polysilicon and silicon dioxide, respectively. Layer 2 can also consist of a layer sequence which will be referred to in detail in connection with FIG. 14. It is furthermore possible to apply the now following layers onto the surface of silicon substrate 1 directly.

Figure 4:
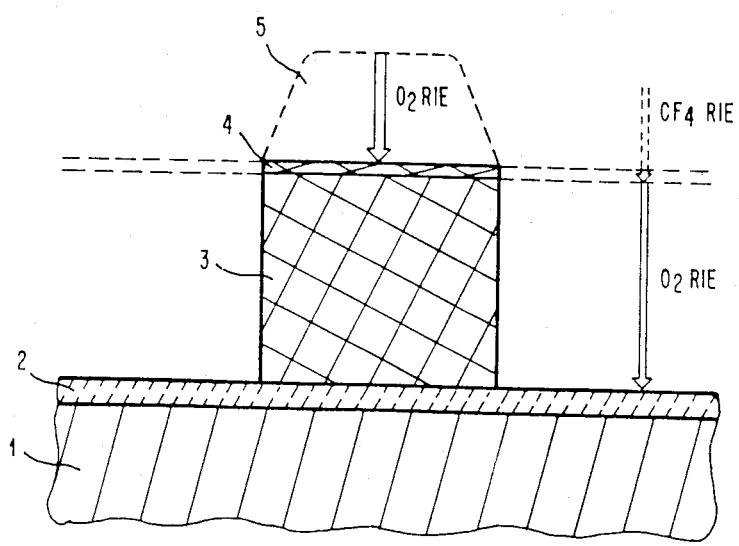
FIG. 4 shows the etching of a vertical polymeric material profile.
Figure 5:
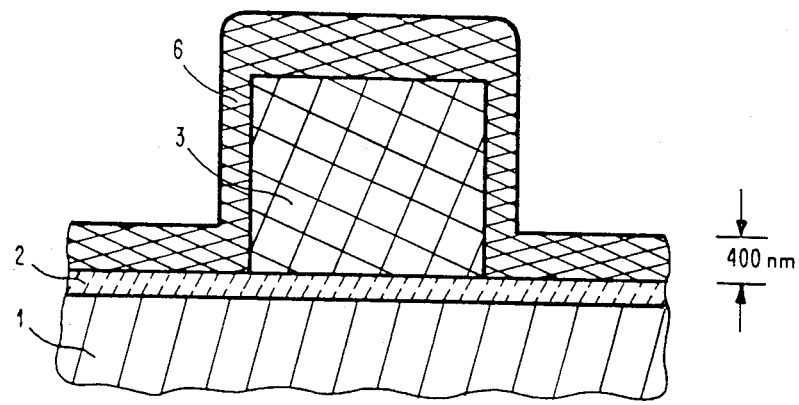
FIG. 5 shows the deposition of silicon nitride or oxide on the horizontal and vertical surfaces of the polymeric material structure.

For making a structure of polymeric material with vertical sidewalls, a polymer, e.g. a polyimide, is applied by spin-coating which is thermally stable up to approximately 400° to 450° C. It should be noted that the layer thickness of the polymeric material determines the height of the silicon nitride or silicon dioxide walls which are made in further steps of the process. It is also possible to apply as polymeric materials a series of known positive or negative resist materials in the desired layer thickness, e.g. of approximately 2.0 $\mu$m. A positive resist material which can e.g. be used is a resist produced by Shipley commercially available under the trade designation 1350J, and consisting of a phenol-formaldehyde resin and a naphthoquinone diazide sensitizer which is identified as 3, 4-dihydroxybenzophenone-4-[naphthoquinone(1,2)-diazide(2)]sulfonate. At a temperature which is equal to, or higher than the deposition temperature of material 6, resist layer 3 is cured for forming the sidewall structure (FIG. 5). Resist layer 3 of the above specified material can e.g. be cured at a temperature of 210° C. for approximately 30 minutes. As an etching barrier for reactive ion etching with oxygen, a silicon nitride layer 4 approximately 100 nm thick is applied on resist layer 3. The silicon nitride is plasma deposited out of an atmosphere containing silane, ammonia and argon at a pressure of approximately 1 mbar and an energy of 100 Watt (energy density 0.05 W/cm$^2$). The time required for this amounts to 3 to 4 minutes approximately. It should be noted that the deposition temperature is 210° C., i.e. this is a so-called "cold process" which does not affect the material of layer 3. In the same manner, it is possible to plasma deposit instead of silicon nitride layer 4 a silicon dioxide layer, or a polysilicon layer on resist layer 3. In the present case, an approximately 1.0 $\mu$m thick resist layer 5 is deposited on plasma silicon nitride layer 4. Layer 5 can consist of the same resist material as layer 3. However, it can also consist of another highly radiation-sensitive photoresist, e.g. a methacrylate resist. In layer 5, a pattern is generated by exposure and development. Subsequently, as depicted in FIG. 4 and FIG. 16, a resist mask 3 with edge angles of maximum steepness is produced through reactive ion etching. For making the desired mask structure with edge angles of maximum steepness these resist sidewalls have to be as steep as possible.

Using the top resist layer 5 as a mask, openings are etched into plasma nitride layer 4. Nitride layer 4 and polymeric or resist layer 3 therebeneath are etched by reactive ions. Plasma nitride layer 4 is etched in a reactor with carbon tetrafluoride under the following conditions:

CF$_4$ flow: 30 cm$^3$/min.;
pressure: 50 $\mu$bar;
energy density: 0.2 Watt/cm$^2$.

Under these conditions, the plasma nitride etching rate is 30 nm/min. approximately.

Layer 4 with the etched openings is used as a mask for etching resist or polymeric layer 3.

Layer 3 is etched in a reactive ion etching process with oxygen, under the following conditions:

O$_2$ flow: 10–100 cm$^3$/min;
pressure: 2–3 $\mu$bar;
energy density: 0.2 Watt/cm$^2$.

The etching rate for a resist amounts to approximately 150 nm/min. under these conditions. In order to arrive at resist sidewalls of maximum steepness, reactive ion etching is carried out at a very low oxygen pressure of approximately 2 to 5 μbar. If operations would take place at a higher oxygen pressure, lateral etching would increase which becomes apparent as lateral sub-etching of the silicon nitride mask. Plasma nitride and resist residues are removed in a known manner by etching with buffered hydrofluoric acid. In connection with the above described three-layer process for making resist sidewalls of maximum steepness, reference is also made to the PCT application WO 80/00639, Western Electric, U.S. priority Sept. 11, 1978 (Ser. No. 941,369).

The structure of polymeric material 3 with vertical sidewalls can also be produced (no figures) in a modified image reversal process (German Pat. No. 25 29 054). This method is inexpensive and not elaborate. It also results in structures with almost vertical sidewalls. In detail, for making a resist image that is negative relative to the original, a photosensitive layer containing a phenolformaldehyde resin, an o-quinonediazide, and a 1-hydroxyethyl-2-alkyl-imidazoline (Monazoline C) is applied on substrate 1, 2 of FIG. 3. This layer is exposed image-wise, and subsequently heated for 10 to 20 minutes to approximately 105° C. During that process, there is a cross-linking in the exposed regions of the photoresist by the Monazoline molecules so that these regions become insoluble in an alkaline developer. After this thermal processing, the photoresist layer is blanket exposed. During this blanket exposure, the photoresist is now decomposed also in those regions which have not been exposed in the image-wise exposure, while there is no further change in the exposed regions. Following development in an alkaline developer, a resist image negative relative to the original is obtained.

Resist structure 3 on substrate 1, 2 made in accordance with the three-layer process FIG. 16 or the modified image reversal process, serves to define position and height of the sidewall mask to be made in the subsequent process steps. FIGS. 5 and 6, FIGS. 17 and 18 depict plasma deposition of silicon nitride 6 on the horizontal and vertical surfaces of resist structure 3 and of substrate 2, as well as the making of plasma nitride walls by removing the nitride from all horizontal surfaces through reactive ion etching, and equally through reactive ion etching the removing of resist 3. Instead of the nitride plasma deposition, it is also possible to vapor deposit on the horizontal and vertical surfaces of the resist structure silicon dioxide or polysilicon at a low temperature.

In accordance with FIG. 5, silicon nitride 6 is plasma deposited out of an atmosphere containing silane, ammonia and argon at a pressure of 1 mbar and an energy density of 100 Watt, at a temperature of 210° C., in a layer thickness of approximately 400 nm. Silicon nitride 6 covers all horizontal and vertical surfaces of resist structure 3 and substrate 2 FIG. 17. Subsequently, the silicon nitride is removed from all horizontal surfaces by reactive ion etching in carbon tetrafluoride. For that purpose, etching takes place e.g. at a $CF_4$ flow of 30 cm$^3$/min., a pressure of approximately 50 μbar and an energy density of 0.2 W/cm$^2$. $CF_4$ etching is interrupted when the entire silicon nitride has been removed from the horizontal surfaces. The etching end point is determined by means of laser interference with 5 to 1-10% overetching. The process steps are carried out analogously when the deposited material consists of silicon dioxide or polysilicon. As described above, resist 3 is removed by reactive ion etching in an oxygen-containing atmosphere. Maintaining a particularly low oxygen pressure is not required for this step.

Figure 6:
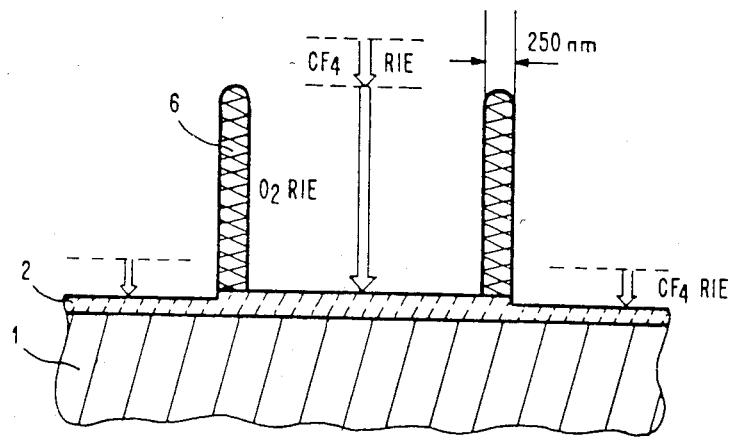
FIG. 6 illustrates the making of silicon nitride or oxide walls by means of the etching.

According to FIG. 6 (FIG. 18), approximately nm thick silicon nitride walls 6 remain after the two previously mentioned etching steps.

Figure 7A:
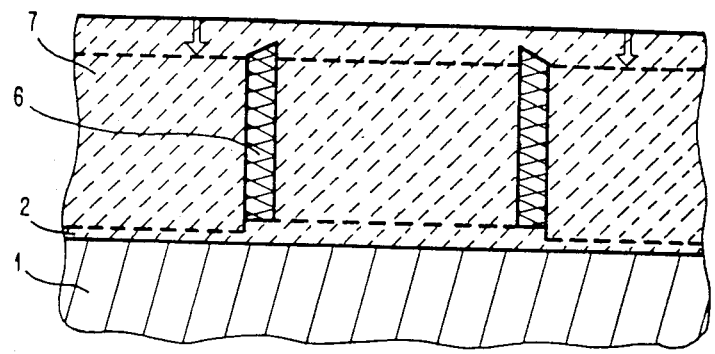
FIG. 7A shows the deposition of the actual mask material.

In negative lithography, there now follows the deposition of the desired mask material (FIG. 7A). Any kind of material that can be deposited by spin-coating can be used for that purpose, e.g. a photoresist, polyimide or glass, or materials that can be sputtered on or vapor deposited, e.g. silicon dioxide, silicon nitride, magnesium oxide, polysilicon, aluminum oxide, metals etc. If silicon dioxide is used as mask material, it can be deposited by means of cathode sputtering, or out of a silane or oxygen containing gas plasma, or by chemical vapor deposition out of a $SiH_4$ and oxygen, or $SiH_2Cl_2$ and $N_2O$ containing atmosphere. The various deposition methods each result in a different type of the silicon dioxide which covers plasma silicon nitride walls 6.

According to FIG. 7A (FIG. 19), silicon nitride walls 6 are e.g. covered with silicon dioxide by means of cathode sputtering. This method is preferred for the present invention. First, approximately 1.3 μm silicon dioxide (standard quartz) are applied by cathode sputtering by means of a standard process. Subsequently, a 0.5 μm thick silicon dioxide layer (planar quartz) is deposited following the planar process by means of cathode sputtering with increased anode efficiency. Following this method, silicon dioxide is removed simultaneously with the deposition, so that structures with a surface topology are substantially planarized (FIG. 7A).

Figure 7B:
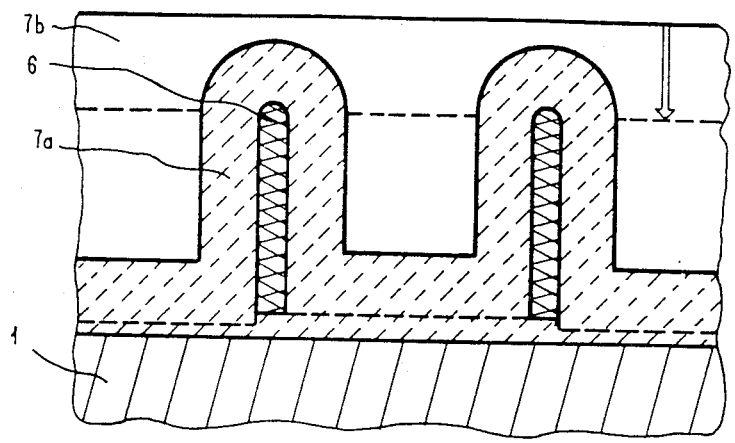
FIGS. 7B to 7C show variations of the mask material deposition method, and surface planarization.
Figure 7C:
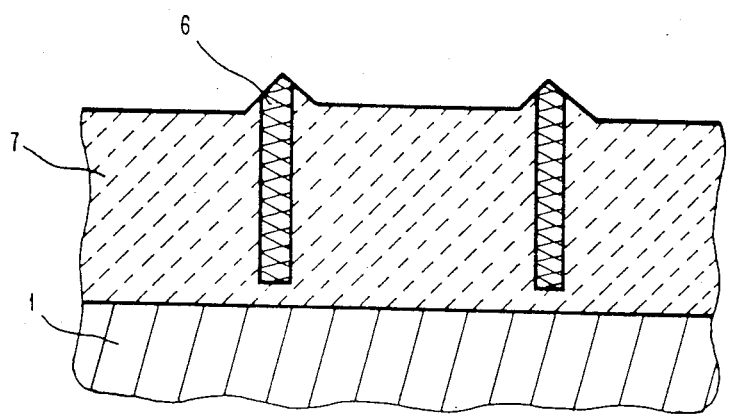

Further ways of covering silicon nitride walls 6 with silicon dioxide are depicted in FIGS. 7B and 7C. Following FIG. 7B, a 0.5 μm thick silicon dioxide layer 7a is chemically vapor deposited on the entire surface of the structure with silicon nitride walls 6. Chemical vapor deposition uses $SiH_4$ and $O_2$ at approximately 500° C., or $SiH_2Cl_2$ and $N_2O$ at approximately 800° C., and atmospheric pressure or less. Subsequently, an approximately 1 μm thick silicon dioxide layer is deposited by means of cathode sputtering, with increased anode efficiency (planar quartz). While the vapor deposited silicon dioxide 7a uniformly grows around the walls, silicon dioxide 7b applied by cathode sputtering effects an increase of the silicon dioxide layer thickness, and a planarization of the regions over the silicon nitride walls 6 (FIG. 7B). Instead of planar quartz, it is also possible to use a photoresist for planarization as layer 7b, and to cure it at 180° C.

Another way of planarizing a structure in accordance with FIG. 7 consists in depositing quartz under the usual cathode sputtering conditions, and to etch back until the peaks of silicon nitride walls 6 have been exposed (FIG. 7C). As already indicated in connection with the planarization in accordance with FIG. 7B, such planarization can also be implemented in such a manner that instead of the quartz deposited by means of cathode sputtering, a photoresist is applied in a layer thickness of 2.0 μm, and cured at 180° C., and that subsequently the resist layer is partly removed until the peaks of the silicon nitride walls have been exposed (FIG. 7C).

Figure 8:
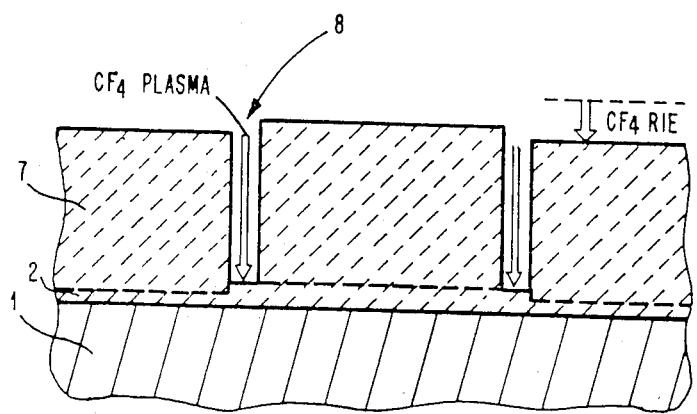
FIG. 8 illustrates removal of the silicon nitride or oxide walls embedded in the mask material.
Figure 9:
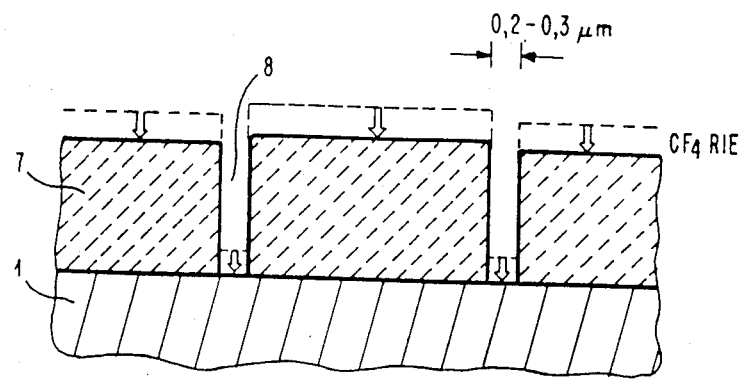
FIG. 9 illustrates opening of the mask down to the substrate by means of reactive ion etching.

In the subsequent process step, the silicon nitride walls embedded in silicon dioxide as a mask material are removed in accordance with FIG. 8 by etching. First, the silicon dioxide is blanket removed in a layer thickness of approximately 0.3 μm by reactive ion etching with $CF_4$. Subsequently, the silicon nitride walls are removed by plasma etching in a system of the LFE Corporation and with carbon tetrafluoride, at a pressure of approximately 1.0 mbar, thus obtaining openings 8 with a width of 0.2 to 0.3 μm reaching down to the $SiO_2$ layer 2. The silicon nitride walls can also be removed by wet etching. According to Fit. 9, openings 8 of the silicon dioxide mask are extended by blanket reactive ion etching with $CF_4$ through layer 2 to silicon substrate 1. This step can also be carried out with $CHF_3$ gas because this ensures a better interruption of the etching process at the silicon substrate surface. During this etching, silicon dioxide is also removed from the mask surface. If the walls 6 defining height and width of mask openings 8 are made of silicon dioxide or polysilicon a photoresist has to be used for planarizing. With polysilicon walls it is also possible to employ quartz. Silicon dioxide or polysilicon walls 6 are removed by wet etching until layer 2 is reached which in this case consists of silicon nitride. FIG. 9 (FIG. 20) represents the finished etching mask consisting of silicon dioxide 7 which can be used for etching trenches in silicon substrate 1. The mask is approximately 0.6 to 1 μm thick, and has openings with practically vertical sidewalls and with a width of 0.2 to 0.3 μm.

Up to now, a method of making a mask using the sidewall technology has been described, resulting in a mask negative to the original mask pattern. Basing on FIG. 6, a method will now be described with reference to FIGS. 14 and 15 according to which sidewalls 6 can be converted into a mask positive to the original pattern, with identical dimensions but made of a different material. According to FIG. 14, layer 2 of the above described figures consists of a double layer, i.e. of a layer 2a of the desired mask material, e.g. a photoresist, of polyimide, silicon dioxide, silicon nitride, polysilicon, metal, or combinations thereof with a thin dielectric layer 2b arranged on layer 2a and consisting of plasma nitride or oxide. Instead of layer 2, a sequence of layers, e.g. silicon dioxide, polyimide, silicon dioxide can also be used. Sidewall structures 6 with the sub-micrometer dimensions are made, as described above, by means of a polymeric material structure with vertical sidewalls. Dielectric layer 2b which consists of silicon dioxide if the sidewalls are made of plasma nitride, is removed by reactive ion etching in carbon tetrafluoride. Layer 2a is removed in the regions not covered by sidewalls 6 by reactive ion etching, too. If layer 2a consists of polymeric material, the reactive ion etching can be executed in an oxygen atmosphere. Subsequently, sidewall structures 6 and the remaining silicon dioxide of layer 2b are removed by plasma etching as described above or wet etching. The result is a positive mask structure with the dimensions of the plasma nitride columns in accordance with FIG. 6 which however are made of the material of layer 2a (FIGS. 14 and 15).

Figure 14:
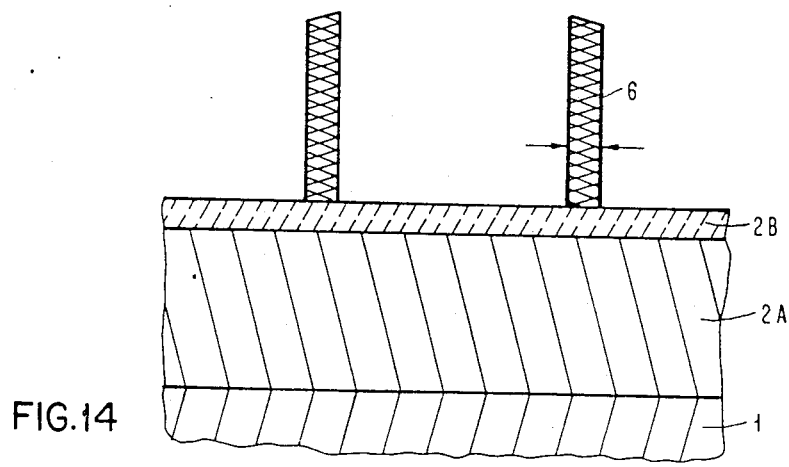
FIG. 14 illustrates reversing the sidewall structure of FIG. 6 into a mask of a different material but with identical dimensions (positive lithography)
Figure 15:
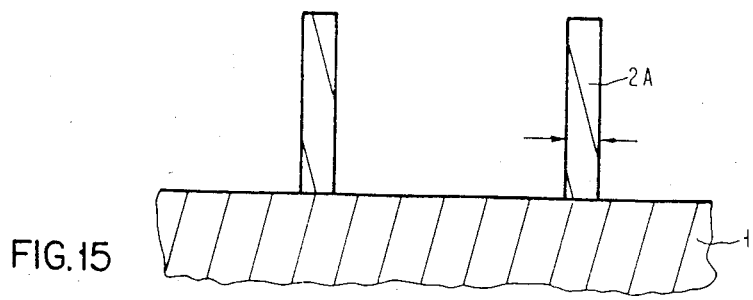
FIG. 15 shows the finished mask of the different material.

If layer 2 of FIG. 14 is made of a layer sequence of e.g. silicon dioxide, polyimide, silicon dioxide the top thin oxide layer, after the production of sub-micrometer mask 6, is etched in a $CF_4$ atmosphere, the polyimide in an oxygen atmosphere, and the silicon dioxide on the surface of the silicon substrate in a $CF_4$ atmosphere with reactive ions. By plasma etching in oxygen, or by dissolving the middle polyimide layer of the etched structures, the final mask of silicon dioxide on the silicon substrate is obtained.

In the following, a specific application of the above described method is discussed, where in a mask reversal process the structures of FIG. 6 are used for making a silicon dioxide mask 7.

Using this mask, trenches are etched in a silicon substrate. The trenches are filled by thermal oxidation, or by the spin-coating of a synthetic material, e.g. polyimide. As a silicon substrate, e.g. a semiconductor chip of P conductive material can be used. On this substrate with a resistivity of 10 Ω-cm in which an N+ conductive region has been made (not shown) an N conductive layer with a maximum impurity concentration of $10^{18}$ atoms/$cm^3$ is epitaxially grown in a conventional method, at a temperature between 950° and 1170° C., and with a duration of approximately 17 minutes. While this layer is deposited, the N+ conductive region diffuses out into this layer. Epitaxial layer 1 (FIG. 3) is between 1 and 4 μm thick, corresponding with the other data of the integrated circuit. For the purposes of the present invention, an epitaxial layer 1 with a thickness of 2.35 μm is assumed, the epitaxial layer being 0.35 μm silicon are used up by oxidation during the implementation of the method as disclosed by the invention. Epitaxial layer 1, to give an example, can be applied using a device and a method as described in U.S. Pat. No. 3,424,629. In accordance with FIG. 3, a layer 2 of dielectric material is then deposited on epitaxial layer 1 in accordance with conventional methods.

Following the basic method shown in FIGS. 1A to 1F, and the specific description, the following procedures can be used for making the trenches and for filling the trenches.

Forming a vertical profile of polymeric material by reactive ion etching, and plasma depositing of silicon nitride or silicon dioxide. As specified above in detail, the forming of the vertical profile of polymeric material is effected in a three-layer process (FIGS. 3 and 4), or in a modified mask reversal process. Plasma depositing of silicon nitride or silicon dioxide on all horizontal and vertical surfaces of the polymeric structure (FIG. 5) is performed at temperatures $\geq 200°$ C. and $\geq 400°$ C. This so-called low temperature process does not effect the polymeric structure materials.

Silicon nitride or silicon dioxide is removed from all horizontal surfaces by reactive ion etching in an atmosphere containing $CF_4$, and the removal of the polymeric material which results in silicon nitride or oxide walls is effected in an oxygen-containing atmosphere. Details of the method were discussed in connection with FIG. 6.

The silicon nitride or dioxide walls are converted in a mask reversal process in openings of a mask by depositing the mask material silicon dioxide over these walls, removing the silicon dioxide by etching until the peaks of the walls are exposed, and removing the silicon nitride or silicon dioxide walls by plasma etching. The method preferred within this embodiment for covering the silicon nitride walls with silicon dioxide is the method discussed in the specification with reference to FIG. 7A, where first approximately 1.3 μm silicon dioxide are deposited following the conventional method, and subsequently about 0.5 μm silicon dioxide are deposited in the planar method by means of cathode sputtering with increased anode efficiency. The silicon nitride walls are removed after the exposure of the peaks by plasma etching with carbon tetrafluoride, and subsequently the openings of the silicon dioxide mask are extended by blanket reactive ion etching with carbon tetrafluoride to the silicon substrate. This process steps were discussed in the specification with reference to FIG. 8.

Figure 1F:
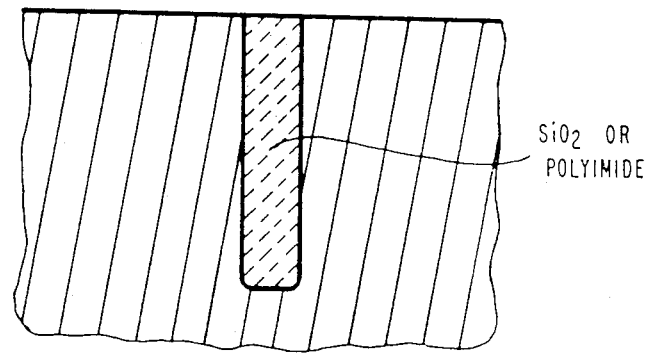
Figure 22:
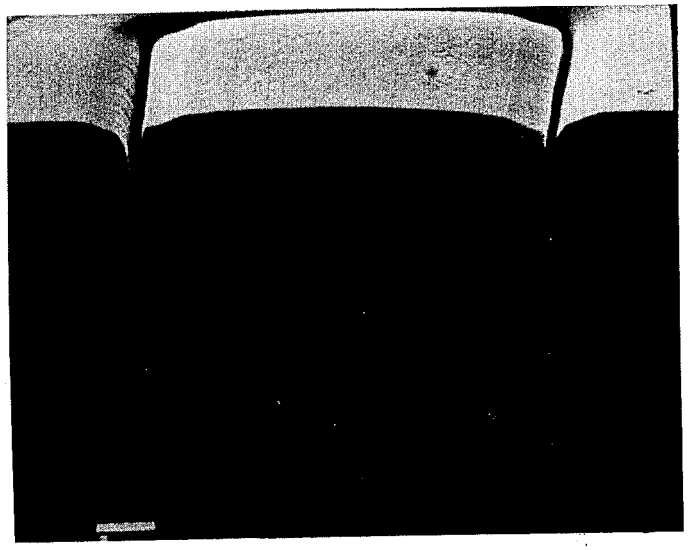
FIG. 22 is a SEM corresponding to FIG. 12 and shows the trenches after having been filled by thermal oxidation.

In the process survey, FIG. 1E shows the etching of the deep trenches in the silicon substrate, and FIG. 1F depicts the filling of the trenches with silicon dioxide or polyimide. The etching of the trenches in the silicon substrate, and their filling will be discussed in the following with reference to FIGS. 10 to 12, and the secondary electron microscope graphs FIGS. 21 and 22.

Figure 10:
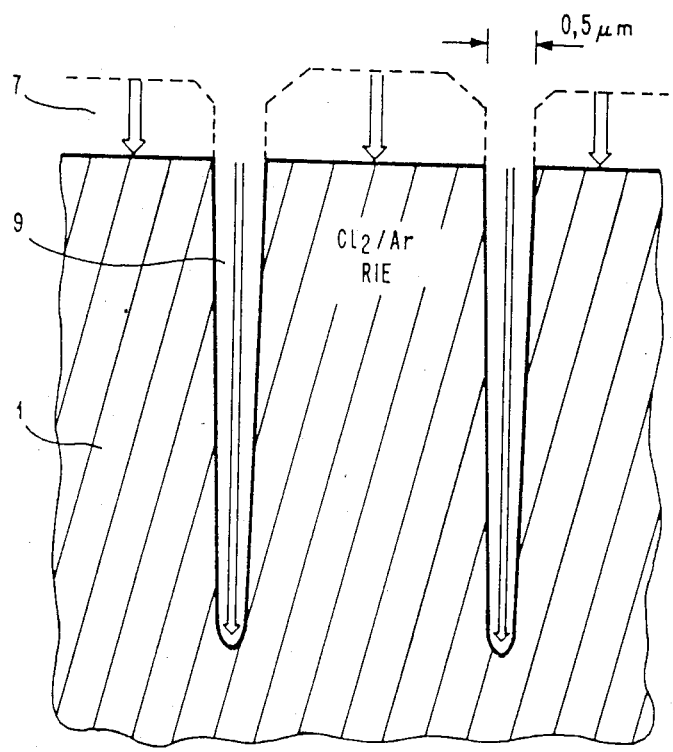
FIG. 10 shows etching deep trenches in the substrate using the mask.

FIG. 10 (FIG. 21) depicts the making of trenches 9 in silicon substrate 1 by etching. The reactive ion etching performed for that purpose is carried out at the following conditions:

etching medium: 10% chlorine, rest argon;
flow: 30 cm$^3$/min.;
pressure: 15 mbar;
energy density: 0.2 Watt/cm$^2$.

Other methods for etching silicon use gas mixtures with a content of $SF_6$, $CL_2$ and helium, or $CCl_2F_2$ and $O_2$ or $SiF_4$, $Cl_2$, helium or argon. Generally, gas mixtures containing chlorine, fluorine, and/or oxygen can be used for the reactive ion etching of silicon. In a system with 10% $Cl_2$ in argon, etching rate ratios of silicon to silicon dioxide of up to 20:1 are obtained in a reactive ion etching device produced by Leybold. If deep and shallow trenches are to be etched simultaneously, the above described etching process has to be carried out twice, or a protective mask has to be used which covers the shallow trenches during the additional etching of the deep trenches. According to FIG. 10, the remaining silicon dioxide etching mask is removed in a wet etching step with buffered hydrofluoric acid.

Figure 11:
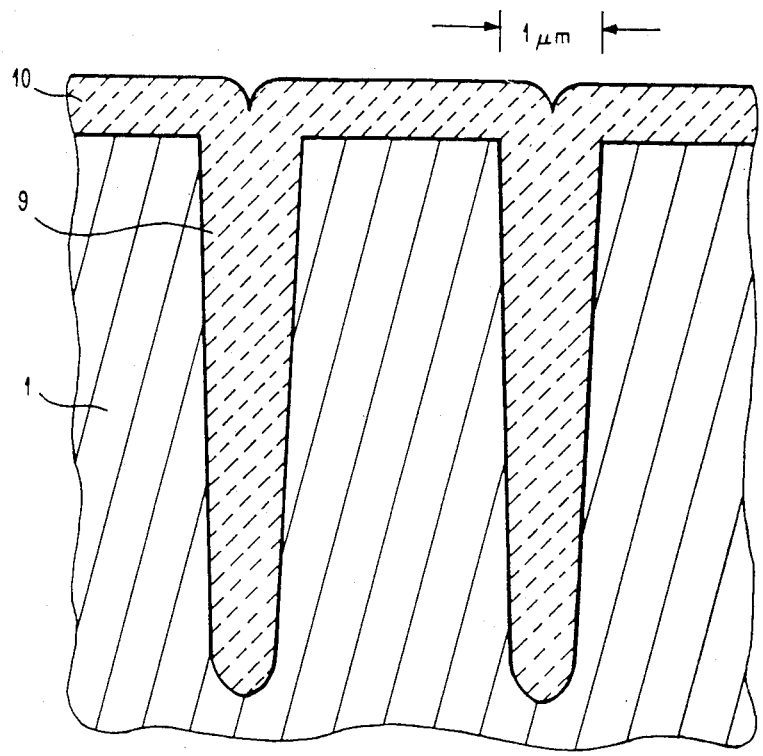
FIG. 11 shows filling these trenches by means of thermal oxidation.
Figure 12:
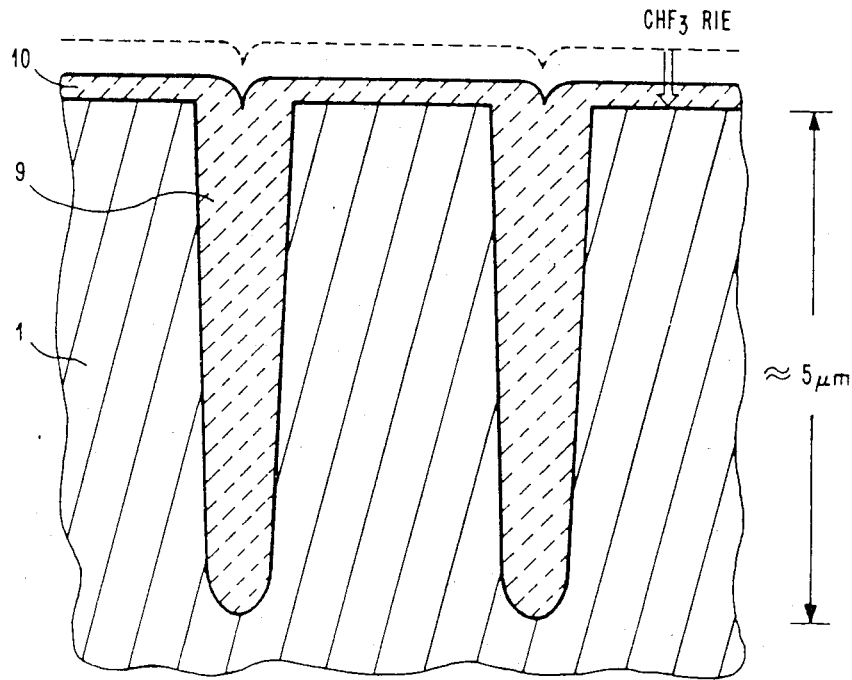
FIG. 12 shows etching the silicon dioxide off the surface, and subsequent reoxidation.

FIG. 11 depicts the filling of the trenches by thermal oxidation. This oxidation takes place at approximately 1000° C., and is implemented as a dry-wet-dry oxidation, until approximately 0.5 μm silicon dioxide has formed in the trenches starting from either side of the trench wall, and on the surface a silicon dioxide of comparable layer thickness has formed. The oxidation can also take place in the form of a high pressure oxidation at 850° C. In order to obtain an oxide layer 10 on silicon substrate surface 1 (FIG. 12, FIG. 22) in a layer thickness necessary for subsequent etching and diffusion processes, the oxide in FIG. 11 is removed by blanket reactive ion etching in $CHF_3$ with the etching being interrupted at the silicon surface. Then, the silicon is reoxidized to a layer thickness of approximately 160 nm (FIG. 12). Instead of the filling of the trenches by thermal oxidation, the following process can be applied (FIG. 13):

(a) thermal oxidation to produce approximately 25 nm silicon dioxide 11;
(b) vapor depositing approximately 50 nm silicon nitride 12;
(c) completely filling the trenches with polyimide 13 which is spun-on in a known manner.

In the following, the essential features and advantages of the method as disclosed by the invention when applied to making deep dielectric isolations with sub-micrometer widths will be repeated:

It is possible to make dielectric isolations with a width of approximately 0.5 to 1.0 μm.

Deep and shallow isolations can be made simultaneously, e.g. a subcollector isolation with a depth of 4 to 5 μm and a base isolation with a depth of 1 μm.

The minimum distance between two isolations is approximately 1.5 to 2.0 μm.

The interface between the isolation and the silicon substrate has a low charge level owing to the thermal oxidation.

Filling the trenches with polyimide instead of by thermal oxidation is particularly advantageous because defects were observed in the silicon when the trenches were completely filled by thermal oxidation. When the filling takes place by vapor deposition of oxide, such defects can be substantially avoided.

The method described is a planar process, therefore the forming of the undesired "bird's heads" is avoided.

The diffusions of subcollector, base and emitter can directly be adjacent to the isolation; the forming of the undesired "bird's beak" is avoided, too. When filling with polyimide takes place, the trenches are etched subsequently to the diffusion of subcollector, base and emitter.

The quality of the devices made in accordance with the method as disclosed by the invention is improved owing to the lower capacity caused by the diffusions directly adjacent to the isolations and owing to shorter electric conductive paths.

There results a higher integration density from the lower isolation width and the diffusions directly adjacent to the diffusions.

The general method as disclosed by the invention for making structures with dimensions in the sub-micrometer range uses, instead of dielectric materials, polymeric materials to define structures with horizontal and vertical surfaces, e.g. a photoresist or polyimide. The polymeric materials can be deposited inexpensively and easily by spin-coating. They can be vertically etched in an excellent manner, particularly using the above described three layer process, with reactive oxygen ions. The polymeric layer determining position and height of the mask can be applied with a much higher layer thickness than e.g. dielectric materials. For that reason, thicker masks can be made than with other processes. With masks having a thickness of e.g. up to 3 μm up to 6 μm deep trenches can be etched in a silicon substrate. The sidewall structures of silicon dioxide or silicon nitride are made in a plasma deposition process that can be carried out at temperatures of ≧200° C., and which represents a so-called low temperature process so that there is no damage of the polymer structures. The process temperatures that are low compared with prior art furthermore permit a more universal applicability of the method. The method as disclosed by the invention is suitable not only for making deep dielectric isolations with a trench width in the sub-micrometer range; further possible uses are e.g. making field effect transistors with a channel length in the sub-micrometer range, or making lateral, bipolar PNP transistors with a base width in the sub-micrometer range.

What is claimed is:

1. Method for fabricating sub-micrometer dimensioned structures using a polymeric layer comprising:
   providing a body to form said structures;
   depositing said polymeric layer upon said body;
   removing portions of said polymeric layer where the edges of the formed openings are at locations where said sub-micrometer dimensioned structures are desired;
   forming a sub-micrometer dimensioned sidewall structure on the said edges of the polymeric layer of substantially the same width as the desired said sub-micrometer dimensioned structures and at a temperature which is less than a temperature which would adversely affect said polymeric layer;
removing the remaining said polymeric layer; and
using the said sidewall structure as the mask to form the sub-micrometer structures in said body.

2. Method for fabricating sub-micrometer dimensioned structures using a polymeric layer comprising:
providing a body to form said structures;
depositing said polymeric layer upon said body;
removing portions of said polymeric layer where the edges of the formed openings are at locations where said sub-micrometer dimensioned structures are desired;
forming a sub-micrometer dimensioned sidewall structure on the said edges of the polymeric layer of substantially the same width as the desired and sub-micrometer dimensioned structures and at a temperature which is less than a temperature which would adversely affect said polymeric layer;
removing the remaining said polymeric layer;
depositing a mask material layer over said sidewall layer;
removing said sidewall layer; and
using as a mask the said maks material layer having the openings left by said sidewall structure for making sub-micrometer structures in said body.

3. Method of making structures with dimensions in the sub-micrometer range in a layer arranged on a silicon substrate comprising:
forming an isolating layer upon said silicon substrate;
forming upon said isolating layer a polymeric layer having substantially horizontal surfaces and substantially vertical surfaces;
forming upon the vertical surfaces of said polymeric layer a sub-micrometer dimensioned sidewall layer at a temperature less than that temperature which would adversely effect said polymeric layer;
removing said polymeric layer in such a manner that said sidewall layer remains upon the isolating layer; and
that in the case of positive lithography the said sidewall layer directly serves as a mask for forming structures in the said substrate with dimensions in the submicrometer range.

4. Method of making structures with dimensions in the sub-micrometer range in a layer arranged on a silicon substrate comprising:
forming an isolating layer upon said silicon substrate;
forming upon said isolating layer a polymeric layer having substantially horizontal surfaces and substantially vertical surfaces;
forming upon the vertical surfaces of said polymeric layer a sub-micrometer dimensioned sidewall layer at a temperature less than that temperature which would adversely effect said polymeric layer;
removing said polymeric layer in such a manner that sidewall layer remains upon the isolating layer;
that in the case of negative lithography the said sidewall layer is embedded into a desired mask material; and
removing said sidewall layer embedded in the mask material by etching which results in mask openings having dimensions in the submicrometer range which serve as a mask for forming structures in said substrate.

5. The method as in claim 3 or 4 wherein the polymeric layer is formed by applying the polymeric layer directly upon the said isolating layer, a layer of plasma deposited silicon nitride upon the polymeric layer and a top layer of a photoresist upon said silicon nitride layer;
forming the desired pattern in the top photoresist layer and transferring the pattern by anisotropic reactive ion etching into the said plasma silicon nitride layer and into the polymeric layer respectively.

6. The method as in claim 5 characterized in that the polymeric layer is a positive photoresist and is between about 1.0 $\mu$m and 2.0 $\mu$m thick, that the said plasma silicon nitride layer is between about 0.2 $\mu$m and 0.5 $\mu$m thick, and that the top said photoresist layer is a highly sensitive photoresist and is between 0.5 $\mu$m to 1.5 $\mu$m thick.

7. The method as in claim 5 wherein the said pattern is transferred from the said top layer by reactive ion etching with $CF_4$ into the said plasma silicon nitride layer, and by reactive ion etching with oxygen at a pressure of less than 5 $\mu$bar into the said polymeric layer.

8. The method as in claim 3 wherein said isolating layer is a silicon dioxide layer and is produced by means of thermal oxidation.

9. The method as in claim 3 or 4 wherein said sidewall layer is silicon nitride deposited upon the said horizontal and substantially vertical surfaces of the said polymeric layer and the exposed said isolating layer by plasma deposition out of an atmosphere containing silane, ammonia and argon, at a pressure of approximately 1 $\mu$bar, an energy of about 100 Watt (energy density of 0.05 Watt/cm$^2$) and a temperature of about 210° C. or less.

10. The method as in claim 9 wherein the said horizontal regions of the silicon nitride layer are removed by reactive ion etching with $CF_4$, and the said polymeric layer removed by reactive ion etching with oxygen.

11. The method as claimed in claim 3 wherein the said isolating layer is composed of two component layers and is removed in the regions not covered by the said sidewall layer by means of reactive ion etching, and that subsequently the said sidewall layer and the remains of the said isolating layer therebeneath are etched off, with a mask with the dimensions of the original pattern, but consisting of the material of the top of said component layers.

12. The method as claimed in claim 4 wherein said mask material is composed of polymeric material.

13. The method as claimed in claim 4 wherein said mask material is deposited by means of a 2 stage sputtering method with a first thicker layer being applied under the standard conditions, and a second, thinner layer being deposited with increased anode efficiency to achieve an improved surface planarity.

14. The method as claimed in claim 4 wherein said mask material is a silicon dioxide layer, and a first portion of said silicon dioxide layer is chemically vapor deposited uniformly over the said sidewall layer walls, and that subsequently by means of sputtering a second thicker silicon dioxide layer is deposited over said first portion with increased anode efficiency to increase the silicon dioxide layer thickness, and to achieve an improved surface planarity.

15. The method as claimed in claim 12 wherein said polymeric material is a photoresist material layer which is spun-on and etched back for surface planarization.

16. The method as claimed in claim 4 wherein said mask material layer is blanket removed by reactive ion etching until the peaks of the said sidewall layer are exposed, and then removing said sidewall layer by etching to form openings in said mask material layer extending to the surface of the said silicon substrate.

17. The method as claimed in claim 16 wherein the said mask material is silicon dioxide, the said sidewall layer is silicon nitride, and the sidewall layer is removed by etching with $CF_4$ to the surface of the silicon substrate.

18. The method for making a deep dielectric isolation with submicrometer width within a silicon body comprising:
forming an isolating layer upon said silicon substrate;
forming upon said isolating layer a polymeric layer having substantially horizontal surfaces and substantially vertical surfaces;
forming upon the vertical surfaces of said polymeric layer a sub-micrometer dimensioned sidewall layer at a temperature less than that temperature which would adversely effect said polymeric layer;
removing said polymeric layer in such a manner that sidewall layer remains upon the isolating layer;
that in the case of negative lithography the said sidewall layer is embedded into a desired mask material;
removing said sidewall layer embedded in the mask material by etching which results in mask openings having dimensions in the submicrometer range which serve as a mask for forming structures in said substrate;
etching trenches through said mask openings into the silicon substrate by reactive ion etching; and
filling said trenches with dielectric material.

19. The method as claimed in claim 18 wherein the said trenches in the silicon substrate are made by reactive ion etching in a $CCl_2F_2$/oxygen ambient.

20. The method as claimed in claim 19 wherein deep and shallow trenches are made in said silicon substrate by covering the designated shallow trenches during an additional etching step which forms the deep trenches.

21. The method as claimed in any one of claim 18 wherein the said trenches are filled by a thermal oxidation to produce thin silicon dioxide layer, a vapor deposition to produce slightly thicker silicon nitride layer and the said trenches are then completely filled with polyimide.

22. The method as claimed in claim 18 wherein after the said trenches are filled by thermal oxidation, the silicon dioxide is removed from the silicon substrate surface by blanket reactive ion etching with $CHF_3$, and that subsequently the silicon substrate is reoxidized to an silicon dioxide layer thickness required for the subsequent processes.

* * * * *